United States Patent
Nishihara et al.

(10) Patent No.: US 12,557,581 B2
(45) Date of Patent: Feb. 17, 2026

(54) ETCHING METHOD AND ETCHING APPARATUS

(71) Applicant: SCREEN Holdings Co., Ltd., Kyoto (JP)

(72) Inventors: Kazuki Nishihara, Kyoto (JP); Yuya Akanishi, Kyoto (JP); Masaki Inaba, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 372 days.

(21) Appl. No.: 18/160,730

(22) Filed: Jan. 27, 2023

(65) Prior Publication Data
US 2023/0290653 A1    Sep. 14, 2023

(30) Foreign Application Priority Data
Mar. 10, 2022    (JP) .................................. 2022-037018

(51) Int. Cl.
*H01L 21/67*    (2006.01)

(52) U.S. Cl.
CPC .. *H01L 21/67069* (2013.01); *H01L 21/67028* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 5,321,264 A | 6/1994 | Kuwabara et al. | |
| 6,508,990 B1 | 1/2003 | Yoshida et al. | |
| 2023/0290644 A1* | 9/2023 | Nishihara | H01L 21/31116 |

FOREIGN PATENT DOCUMENTS

| | | |
|---|---|---|
| JP | S58-25478 A | 2/1983 |
| JP | H05-29423 A | 2/1993 |
| JP | 2000-091295 A | 3/2000 |
| JP | 2007-266490 A | 10/2007 |
| JP | 2008-244292 A | 10/2008 |

(Continued)

OTHER PUBLICATIONS

Request for the Submission of an Opinion dated Mar. 20, 2024 in corresponding Korean Patent Application No. 10-2023-0014397 and a computer generated English translation obtained from the JPO.

(Continued)

*Primary Examiner* — Roberts P Culbert
(74) *Attorney, Agent, or Firm* — OSTROLENK FABER LLP

(57) ABSTRACT

An etching method according to the present invention includes after a step of creating a reduced pressure state, a step of supplying an etching gas containing hydrogen fluoride into a processing chamber and etching a coating film formed on a substrate, after the step of etching the coating film, a step of cleaning the substrate by supplying vapor into the processing chamber, and in the step of cleaning the substrate, a step of detecting Si—F stretching vibration in the substrate by infrared spectroscopy, in which the step of cleaning the substrate ends when the Si—F stretching vibration equal to or lower than a predetermined first threshold value is detected. Therefore, the time required for cleaning the substrate is prevented from being unnecessarily long.

4 Claims, 6 Drawing Sheets

(56) References Cited

FOREIGN PATENT DOCUMENTS

JP            2018-056465 A      4/2018

OTHER PUBLICATIONS

Office Action with Search Report dated Mar. 19, 2025 in corresponding Taiwanese Patent Application No. 112102148 and an English translation made from the Japanese translation of the original communication.
U.S. Appl. No. 18/160,939 based on JP 2022/037020, filed Mar. 10, 2022 is a related (co-pending application) to this application.
Notice of Decison to Grant dated Aug. 5, 2025 in corresponding Japanese Patent Application No. 2022-037018.

\* cited by examiner

F I G. 3
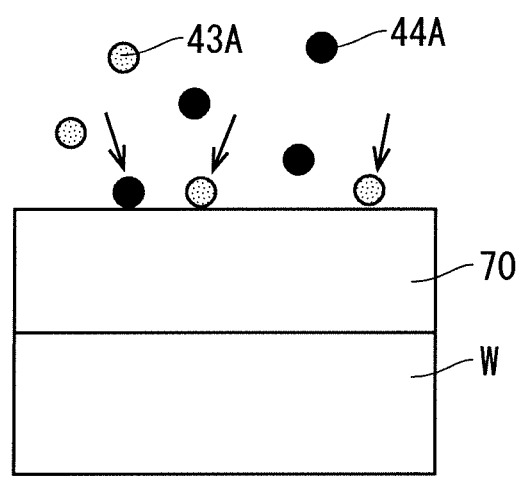

F I G. 5
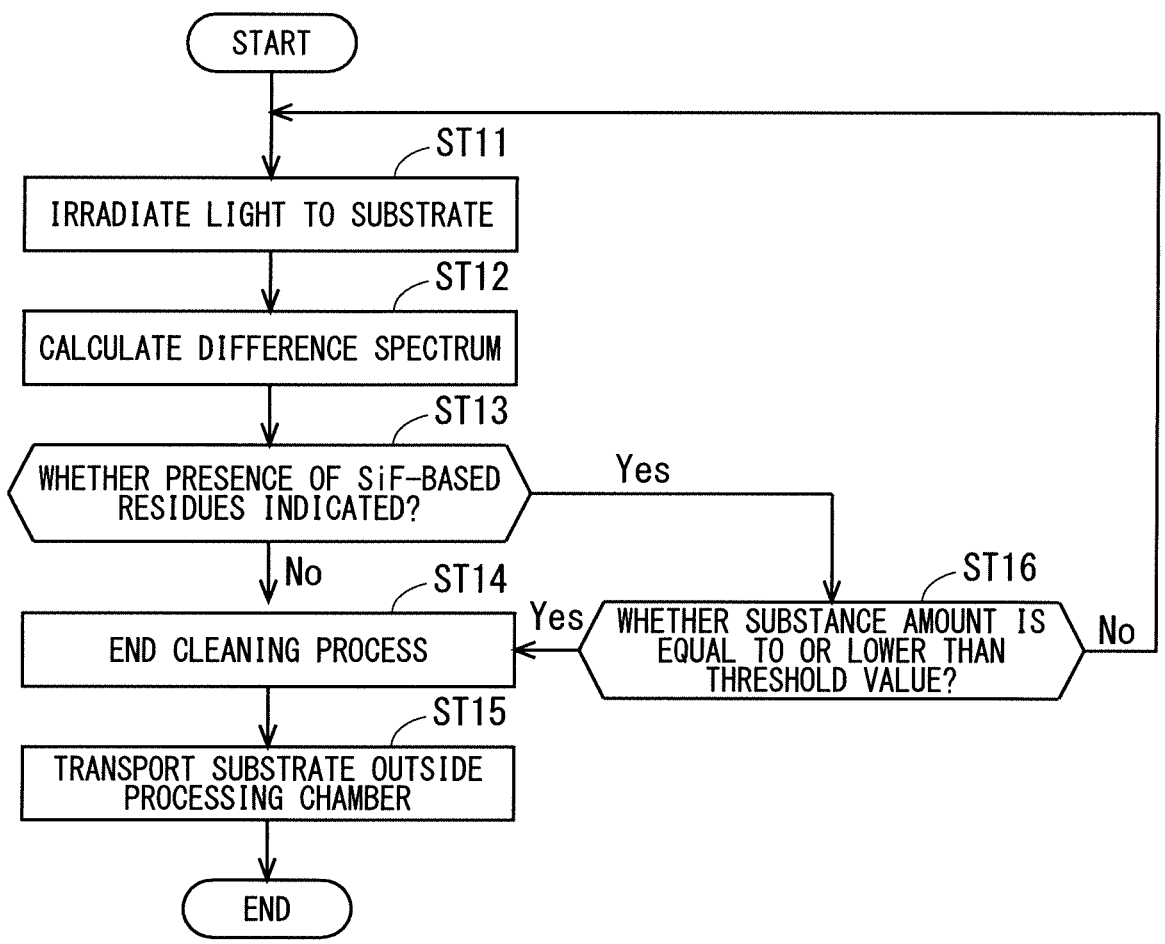

ETCHING METHOD AND ETCHING APPARATUS

BACKGROUND OF THE INVENTION

Field of the Invention

The technique disclosed in the specification of the present application relates to an etching technique for a substrate. A substrate to be subjected to treatment includes, a semiconductor wafer, a glass substrate for liquid crystal display device, a substrate for flat panel display (FPD) such as an organic EL (electroluminescence) display device, an optical disk substrate, a magnetic disk substrate, a magneto-optical disk substrate, a glass substrate for photomask, a ceramic substrate, a substrate for field emission display (FED), and a substrate for solar cell, for example.

Description of the Background Art

A process of etching a coating film formed on a substrate is included in manufacturing processing of a semiconductor device. Coating films formed on substrates include, for example, silicon oxide films and silicon nitride films.

Conventionally, wet etching based on hydrofluoric acid has been adopted for etching silicon oxide films, for example. However, as the pattern to be formed becomes finer along with the progress in the higher integration of semiconductor devices, wet etching causes problems such as the pattern collapsing due to the surface tension of water.

Therefore, a vapor-phase etching technique using hydrofluoric acid vapor or a vapor-phase etching technique using anhydrous gaseous hydrogen fluoride has been adopted (see Japanese Patent No. 6782140, for example).

In the vapor-phase etching technique, fluorine remains on the surface of the silicon substrate after etching. When fluorine remains on the silicon surface after the silicon oxide film has been etched, the residual fluorine and silicon react with each other, causing problems such as the generation of defects in silicon and the formation of particles.

Therefore, a step of washing the etched substrate for a period of time assumed to sufficiently remove fluorine is provided. However, there has been a problem that the right timing at which fluorine is sufficiently removed is difficult to determine, which makes it long to perform the cleaning process more than necessary.

SUMMARY

The present invention is directed to an etching method and an etching apparatus.

An aspect of the present invention is an etching method including the steps of: creating a reduced pressure state inside of a processing chamber accommodating the substrate, after the step of creating the reduced pressure state, supplying an etching gas containing hydrogen fluoride into the processing chamber and etching the coating film formed on the substrate, after the step of etching the coating film, cleaning the substrate by supplying vapor into the processing chamber, and in the step of cleaning the substrate, detecting Si—F stretching vibration in the substrate by infrared spectroscopy. The step of cleaning the substrate ends when the Si—F stretching vibration equal to or lower than a predetermined first threshold value is detected.

The cleaning process of the substrate ends at the timing at which the residues are removed; therefore, the time required for cleaning the substrate is suppressed from being unnecessarily long while the SiF-based residues remaining on the upper surface of the substrate after the etching of the coating film are appropriately removed.

An aspect of the present invention is an etching apparatus including: a decompression pump configured to create a reduced pressure state inside of a processing chamber accommodating the substrate, an etching gas supply unit configured to supply an etching gas containing hydrogen fluoride into the processing chamber, a vapor supply unit configured to supply vapor into the processing chamber, a detection unit configured to detect Si—F stretching vibration in the substrate by infrared spectroscopy, and a controller configured to control an operation of at least the etching gas supply unit, the vapor supply unit, and the detection unit, in which the controller is configured to control the etching gas supply unit so that the etching gas is supplied into the processing chamber which is in the reduced pressure state, control the vapor supply unit so that the vapor is supplied into the processing chamber after the etching gas is supplied, control the detection unit so that the Si—F stretching vibration is detected in the processing chamber with the vapor being supplied, and control the vapor supply unit so that the supply of vapor is stopped when the Si—F stretching vibration equal to or lower than a predetermined threshold value is detected in the substrate.

The cleaning process of the substrate ends at the timing at which the residues are removed; therefore, the time required for cleaning the substrate is suppressed from being unnecessarily long while the SiF-based residues remaining on the upper surface of the substrate after the etching of the coating film are appropriately removed.

Therefore, an object of the present invention is to suppress the time required for cleaning the substrate from being unnecessarily long.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram conceptually illustrating an etching process;

FIG. 5 is a flow chart illustrating an example of an ending operation of a cleaning process of the substrate.

DESCRIPTION OF THE PREFERRED EMBODIMENTS

Figure 1:
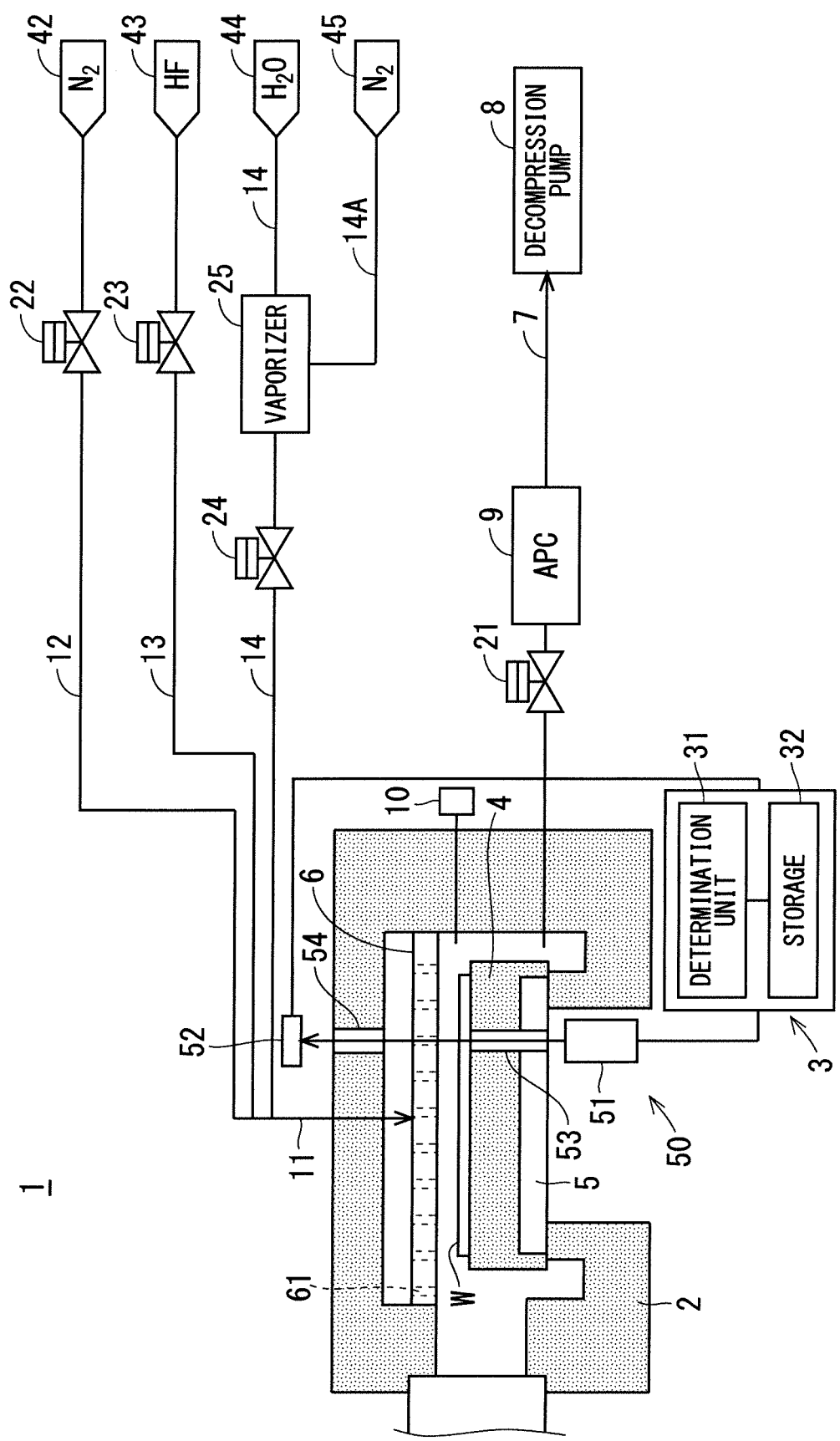
FIG. 1 is a side view schematically illustrating an example of a configuration of an etching apparatus according to an embodiment.

Hereinafter, an embodiment will be described with reference to the attached drawings. In the following embodiment, although detailed features and the like are also shown for technical explanation, they are mere examples, and not all the features to be described are essential for the feasibility of the embodiment.

It should be noted that the drawings are schematically illustrated, and for the convenience of explanation, some omissions or simplifications of the configuration may be made in the drawings as appropriate. Also, the mutual relationship among sizes and positions in configurations and the like illustrated in different drawings are not necessarily accurately described, and may be changed as appropriate. In addition, in the drawings such as plan views that are not cross-sectional views, hatching may be given to facilitate understanding of the contents of the embodiment.

In addition, in the following description, the same components are denoted by the same reference numerals, and the names and functions thereof are also similar. Accordingly, detailed descriptions thereof may be omitted to avoid redundancy.

Also, in the description written in the specification of the present application, when it is described that a certain component is "equipped", "included", or "an object has a certain component", etc., such wording does not exclude the existence of another component unless otherwise specified.

Also, in the description written in the specification of the present application, even though ordinal numbers such as "first" and "second" may be used, these terms are for promoting the understanding of the contents and are not for defining the order caused by such ordinal numbers.

Also, in the description to be made in the specification of the present application, even though terms indicating specific positions or directions such as "upper", "lower", "left", "right", "side", "bottom", "front", and "back" may be used, these terms are for promoting the understanding of the contents of embodiments and are not related to the positions or directions at the time of implementation of the embodiments.

EMBODIMENT

An etching method and an etching apparatus according to an embodiment will be described below.

<Configuration of Etching Apparatus>

FIG. 1 is a side view schematically illustrating an example of a configuration of the etching apparatus according to the present embodiment. An etching apparatus 1 is a single-wafer etching apparatus that processes substrates W such as semiconductor wafers one by one.

In the present embodiment, although the coating film containing silicon to be etched is assumed to be a silicon oxide film, the coating film is not limited thereto, and may be, for example, a silicon nitride film. Also, the silicon oxide film may be a thermal silicon oxide film formed by thermal oxidation, a Tetra Ethoxy Silane (TEOS) film obtained by using a chemical vapor deposition (CVD) method, a Boron Silicate Glass (BSG) film obtained by a CVD method, a silicon oxide film containing a large amount of impurities such as a Phospho Silicate Glass (PSG) film and a Boron doped Phospho Silicate Glass (BPSG) film, or other silicon oxide film, or the like.

As an example is illustrated in FIG. 1, the etching apparatus 1 includes a processing chamber 2 being a chamber or the like for processing a substrate W, and a controller 3 that controls the operation of devices provided in the etching apparatus 1 or the opening and closing of valves. The controller 3 includes a determination unit 31 that performs a predetermined determination based on input information, a storage 32 that stores the input information, the determination result of the determination unit 31, information output from the determination unit 31, and the like.

The processing chamber 2 has a cylindrical shape, for example, and has a processing space in which the substrate W is processed. A substrate holder 4 is installed in the processing chamber 2 to hold the substrate W in a substantially horizontal posture. The substrate W is transported into the processing chamber 2 by a transport system (not illustrated) and then placed on the substrate holder 4.

In the processing chamber 2, the substrate holder 4 that holds the substrate W, a heating mechanism 5 built into the substrate holder 4 that heats the substrate W, a gas distribution plate 6 positioned above the substrate holder 4 in the processing chamber 2, an exhaust pipe 7 connected in communication with the processing chamber 2 to reduce the pressure in the processing chamber 2, a pressure sensor 10 connected to the processing chamber 2, and a pipe 11 (mixed gas pipe) connected in communication with the upper portion of the processing chamber 2 are provided.

The substrate holder 4 may hold the substrate W with a chuck pin or the like, or may have the substrate W attached to the upper surface of the substrate holder 4 by suction.

The substrate W is heated to a predetermined temperature in the range of 30° C. to 200° C. by the heating mechanism 5 built in the substrate holder 4. As the heating mechanism 5, for example, a resistance heating electric heater is assumed.

The gas distribution plate 6 is formed with a plurality of openings 61 and is provided above the substrate W so as to separate the upper portion and the lower portion of the inside of the processing chamber 2. The gas supplied from the pipe 11 is dispersed through the plurality of openings 61 of the gas distribution plate 6 and then supplied below the gas distribution plate 6. In the present embodiment, the plurality of openings 61 having an inner diameter of 0.1 mm are formed in the gas distribution plate 6 at intervals of 5 mm. Note that the inner diameter and the intervals of the openings are not limited thereto. Also, the gas distribution plates 6 may be installed in a plurality of stages.

The pressure sensor 10 is a sensor that measures the pressure (degree of vacuum) in the processing chamber 2, and outputs the pressure measurement result to the controller 3 by wired or wireless communication means.

The exhaust pipe 7 includes a control valve 21, an Auto Pressure Controller (APC) valve 9 positioned downstream of the control valve 21, and a decompression pump 8 positioned downstream of the APC valve 9, and that decompresses the inside of the processing chamber 2 via an exhaust pipe 7. The APC valve 9 controls the pressure inside the processing chamber 2 by adjusting the exhaust flow rate from the processing chamber 2. The determination unit 31 in the controller 3 adjusts the opening degree of the APC valve 9 so that the pressure inside the processing chamber 2 measured by the pressure sensor 10 becomes a desired pressure. Adjusting the pressure in two stages, at the control valve 21 and the APC valve 9, allows accurate pressure adjustment over a wide pressure range. A mechanism where either the control valve 21 or the APC valve 9 is excluded may be adopted depending on the device specifications.

In the present embodiment, although the decompression pump 8 is described as decompression means in the processing chamber 2, the decompression means is not limited thereto, and decompression may be performed by factory utility exhaust, for example.

The pipe 11 is connected to a pipe 12, a pipe 13, and a pipe 14 on the upstream side, and is the pipe where the gas supplied from each pipe merges. The gas merged in the pipe 11 is supplied to the upper portion of the processing chamber 2.

The pipe 12 is provided with a control valve 22 and a nitrogen supply source 42 located upstream of the control valve 22. The control valve 22 controls the flow rate of nitrogen (inert gas) supplied from the nitrogen supply source 42 to the pipe 12.

The pipe 13 is provided with a control valve 23 and a gaseous hydrogen fluoride supply source 42 positioned upstream of the control valve 33. The control valve 23 controls the flow rate of gaseous hydrogen fluoride supplied from the gaseous hydrogen fluoride supply source 43 to the pipe 13. For the gaseous hydrogen fluoride supply source 43, for example, a high-pressure cylinder of anhydrous hydrogen fluoride is used.

The pipe 14 is provided with a control valve 24, a vaporizer 25 positioned upstream of the control valve 24, and a vapor supply source 44 positioned upstream of the vaporizer 25. Further, a nitrogen supply source 45 is provided upstream of a pipe 14A branched from the pipe 14 in the vaporizer 25.

In the vaporizer 25, pure water (DIW) supplied from the vapor supply source 44 is vaporized by nitrogen (inert gas) supplied from the nitrogen supply source 45 and pumped. Then, the control valve 24 controls the flow rate of the vaporized vapor supplied from the pipe 14 to the pipe 11.

The etching apparatus 1 further includes a Fourier-transform infrared spectroscopy (FTIR) 50 as an analyzer that analyzes the inside of the processing chamber 2 by infrared spectroscopy. In the present embodiment, although the FTIR 50 is adopted as the infrared spectrophotometer corresponding to the analyzer, a dispersive infrared spectrophotometer is also adoptable.

The FTIR 50 is arranged below the substrate W and includes a light source 51 that irradiates the substrate W with light from below, and a light receiving unit 52 that receives the light emitted from the light source 51 above the substrate W.

The light emitted from the light source 51 enters the processing chamber 2 through a light projection window 53 provided below the substrate W, and then passes through the substrate W. The light emitted from the light source 51 passes through the opening 61 of the gas dispersion plate 6, reaches the light receiving window 54 provided above the substrate W, and enters the light receiving unit 52 from the light receiving window 54. Here, for example, the opening 61 of the gas dispersion plate 6 is preferably arranged along a straight line connecting the light source 51 and the light receiving unit 52 so that the light emitted from the light source 51 can reach the light receiving unit 52 without being interfered with the gas dispersion plate 6. In the present embodiment, although the light source 51, the light receiving unit 52, and the opening 61 of the gas dispersion plate 6 are arranged at an overlapping position in plan view, the arrangement of the three sides is not limited thereto.

The light projection window 53 and the light receiving window 54 are made of a substance that is transparent to infrared light and has high vacuum resistance (for example, quartz).

The determination unit 31 of the controller 3 calculates the transmission spectrum by Fourier transforming the interferogram of the light received by the light receiving unit 52 of the FTIR 50. The determination unit 31 calculates respective transmission spectra in the state to be measured (for example, the state where the substrate W is held after implementation of the etching process) and in the reference state (for example, the state where the substrate W is held before implementation of the etching process), and determines the presence or absence of a sample to be detected based on the difference between them.

In addition to the above, the determination unit 31 of the controller 3 implements the temperature control of the heating mechanism 5 the flow rate control of the control valve 22, the flow rate control of the control valve 23, the flow rate control of the control valve 24, the flow rate control of the control valve 21, the exhaust operation of the decompression pump 8, the measurement operation of the pressure sensor 10, the adjustment of the opening degree of the APC valve 9, and the like in the etching apparatus 1.

The gas supplied from the pipe 11 into the processing chamber 2 is selected from nitrogen, gaseous hydrogen fluoride, and vapor by the controller 3 controlling each control valve. The selected gas passes through the gas distribution plate 6 and reaches the substrate W within the processing chamber 2.

The supply amount of gaseous hydrogen fluoride supplied to etch the coating film such as the silicon oxide film formed on the substrate W is, for example, 100 cc/min to 2000 cc/min. The supply amount of vapor to be mixed with the gaseous hydrogen fluoride is 300 cc/min to 10000 cc/min, for example.

In the step of cleaning the substrate surface after etching the silicon oxide film (described later), the supply amount of vapor is 300 cc/min to 10000 cc/min, for example.

Further, the pressure inside the processing chamber 2 is maintained at, for example, 1 Pa or more and 30000 Pa or less during the processing of the substrate W. Depending on the supply amount of vapor supplied and the supply amount of mixed gas of vapor and gaseous hydrogen fluoride, the controller 3 adjusts the opening degree of the APC valve 9 such that the pressure in the processing chamber 2 indicated by the pressure sensor 10 becomes a predetermined pressure, thereby controlling the pressure in the processing chamber 2.

<Operation of Etching Apparatus>

Figure 2:
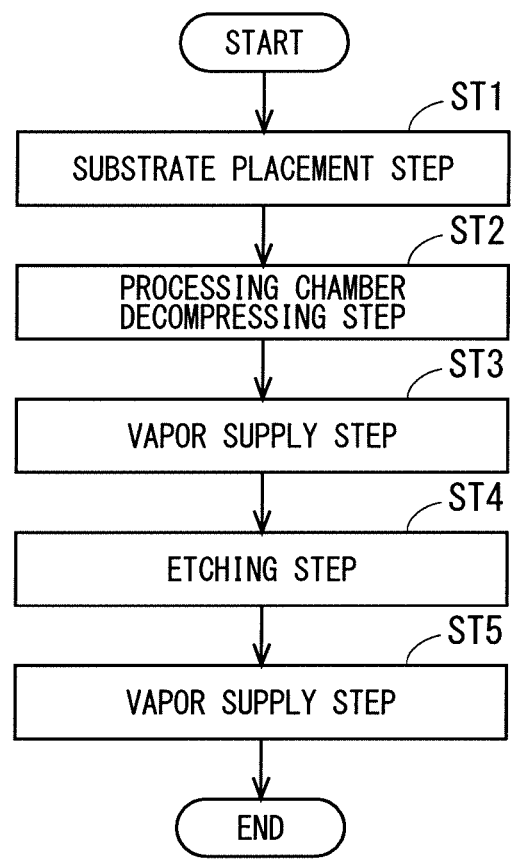
FIG. 2 is a flow chart illustrating an example of an operation of the etching apparatus according to the embodiment.

The operation of the etching apparatus according to the embodiment will be described below. FIG. 2 is a flow chart illustrating an example of the operation of the etching apparatus according to the present embodiment. The following operation is executed under the control of the controller 3.

First, the substrate W is transported into the processing chamber 2 by the transport system (not illustrated) and then placed on the substrate holder 4 (Step ST1). Then after the substrate W is placed on the substrate holder 4, the substrate W is heated to a predetermined temperature in the range of 30° C. to 200° C. by the heating mechanism 5 built in the substrate holder 4.

Next, after the substrate W is placed on the substrate holder 4, the decompression pump 8 starts evacuating the processing chamber 2 (Step ST2). Evacuation is executed until the pressure in the processing chamber 2 reaches approximately 0.1 Pa, and the atmospheric atmosphere in the processing chamber 2 is exhausted.

The evacuation time is determined depending on the capacity of a vacuum pump used for evacuation and the allowable evacuation time. And, if the pressure is reduced as much as possible, the atmosphere inside the processing chamber 2 is exhausted and the inside of the processing chamber 2 becomes cleaner.

Next, after the pressure inside the processing chamber 2 reaches approximately 0.1 Pa, vapor is supplied into the processing chamber 2 through the pipes 14 and 11 (Step ST3). The supply flow rate of vapor is adjusted to a predetermined flow rate by the control valve 24, and vapor is supplied into the processing chamber 2 through the pipe 11.

The pressure in the processing chamber 2 is monitored by the pressure sensor 10 and the controller 3 controls the opening degree of the APC valve 9 based on the pressure indicated by the pressure sensor 10 so that the pressure in the processing chamber 2 reaches a predetermined degree of vacuum. Although the supply time of vapor in Step ST3 is not particularly limited, it need only be a time (for example, about 1 second or more and 10 seconds or less) for forming a thin water layer on the entire surface of the substrate W.

Vapor is supplied to the entire surface of the substrate W through the plurality of openings 61 of the gas distribution plate 6. The vapor reaching the entire surface of the substrate W forms a thin water layer on the upper surface of the substrate W.

After the vapor is supplied for a predetermined time, gaseous hydrogen fluoride is adjusted to a predetermined supply flow rate by the control valve 23, further, the vaporized vapor is adjusted to a predetermined supply flow rate by the control valve 24, and then, gaseous hydrogen fluoride and vapor are mixed in the pipe 11 to form a mixed gas. Then, the mixed gas is supplied into the processing chamber 2 through the pipe 11.

Next, the mixed gas supplied into the processing chamber 2 passes through the plurality of openings of the gas distribution plate 6 and is uniformly supplied to the entire surface of the substrate W, and furthermore, etches the silicon oxide film formed on the upper surface of the substrate W (Step ST4). That is, the above mixed gas serves as an etching gas.

FIG. 3 is a diagram conceptually illustrating the etching process. As an example is illustrated in FIG. 3, the silicon oxide film 70 formed on the upper surface of the substrate W is etched by the mixed gas of gaseous hydrogen fluoride 43A and the vapor 44A.

The supply flow rates of the vapor 44A and the gaseous hydrogen fluoride 43A are determined in advance according to the film type of the coating film to be etched. For example, when etching the silicon oxide film 70 as in the present embodiment, the supply flow rate of the vapor 44A is set in the range of 300 cc/min to 10000 cc/min, and the supply flow rate of the gaseous hydrogen fluoride 43A is set in the range of 100 cc/min to 2000 cc/min.

In the present embodiment, the vapor is supplied prior to the above mixed gas (etching gas). Therefore, a film of water (water film) is formed on the upper surface of the substrate W before the gaseous hydrogen fluoride 43A, which is etching species for the silicon oxide film 70, reaches the upper surface of the substrate W. Therefore, etching starts immediately.

When the etching of the silicon oxide film 70 by the etching gas ends, the control valve 23 is closed to stop the supply of the etching gas. Meanwhile, after the etching process, the vapor 44A is supplied by adjusting the control valve 24 and supplied into the processing chamber 2 from the pipe 14 (Step ST5).

Figure 4:
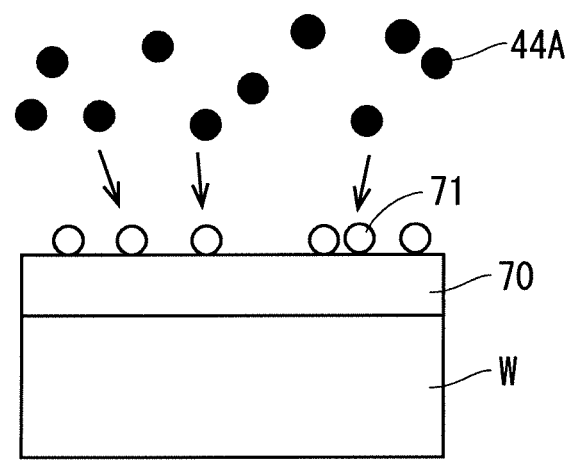
FIG. 4 is a diagram conceptually illustrating a step of supplying vapor after the end of the etching process.

FIG. 4 is a diagram conceptually illustrating a step of supplying vapor after the end of the etching process. As an example is illustrated in FIG. 4, residues 71 left after the etching process remain on the upper surface of the substrate W, and the vapor 44A is supplied to the substrate W.

The vapor 44A supplied after the etching process reaches the entire surface of the substrate W through the plurality of openings 61 of the gas distribution plate 6. Fluorine (SiF-based residues 71) remaining on the surface of the substrate W is removed by supplying the vapor 44A to the substrate W after the etching of the silicon oxide film 70 to clean (wash away) the substrate.

In the present embodiment, vapor is supplied into the processing chamber 2 after the etching process using the pipe 11 for supplying the etching gas into the processing chamber 2. However, a pipe different from the pipe 11 may be used as the pipe for supplying vapor after the etching process. In such a case, the gaseous hydrogen fluoride remaining inside the pipe 11 when supplying the etching gas is prevented from being supplied into the processing chamber 2 when supplying vapor after the etching process.

<Ending Operation of Cleaning Process of Substrate>

The ending operation of the cleaning process (corresponding to Step ST5) of the substrate W in FIG. 2 will be described below. FIG. 5 is a flow chart illustrating an example of the ending operation of the cleaning process of the substrate W.

First, during the cleaning of the substrate W held by the substrate holder 4, the substrate W is irradiated with light (infrared light) from the light source 51 of the FTIR 50 (Step ST11 in FIG. 5). The light emitted from the light source 51 enters the processing chamber 2 through a light projection window 53 provided below the substrate W, and then passes through the substrate W. The light passes through the opening 61 of the gas dispersion plate 6, reaches the light receiving window 54 provided above the substrate W, and enters the light receiving unit 52 from the light receiving window 54.

The light irradiated from the light source 51 is absorbed based on the vibration or rotational motion of molecules present on and above the surface of the substrate W; therefore, the molecules present on and above the surface of the substrate W can detect by comparing the infrared absorption spectrum (measurement spectrum) of the light entered into the light receiving unit 52 through the above-described route with the infrared absorption spectrum (reference spectrum) of the reference light. Note that the reference spectrum corresponds to, for example, the spectrum of light that enters in a state where the substrate W is held before the etching process is implemented.

Figure 6:
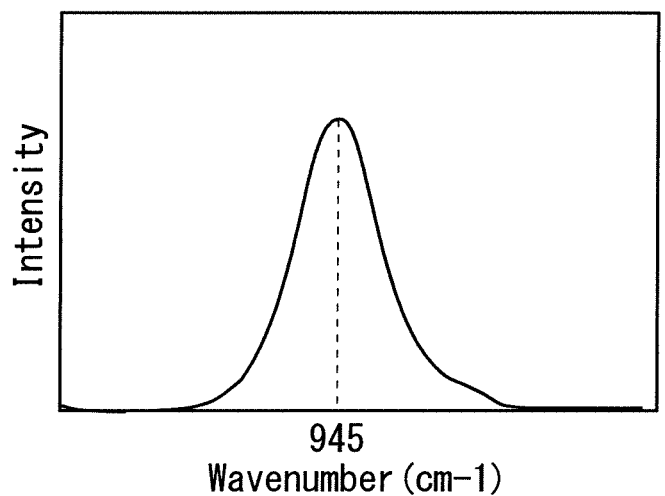
FIG. 6 is a graph conceptually illustrating an infrared absorption spectrum illustrating the Si—F stretching vibration.

FIG. 6 is a graph illustrating an infrared absorption spectrum illustrating the Si—F stretching vibration. In FIG. 6, the vertical axis represents intensity, and the horizontal axis represents wavenumber ($cm^{-1}$). As illustrated in FIG. 6, the infrared absorption spectrum illustrating the Si—F stretching vibration peaks at a value of 945 $cm^{-1}$.

According to FIG. 6, in the FTIR 50, SiF-based substances present on and above the upper surface of the substrate W can be detected, when the infrared absorption spectrum detected as the difference between the measured spectrum and the reference spectrum (difference spectrum) peaks at the value corresponding to the wavenumber of the infrared absorption spectrum illustrating the Si—F stretching vibration illustrated in FIG. 6. Further, according to the height (intensity) of the peak corresponding to the Si—F stretching vibration, the substance amount of SiF-based substances present on and above the upper surface of the substrate W can be measured.

Therefore, the determination unit 31 of the controller 3 calculates the measured spectrum by Fourier transforming the interferogram input from the light receiving unit 52, and further calculates the difference spectrum based on the measured spectrum and the reference spectrum stored in the storage 32 in advance (Step ST12 in FIG. 5). Then, the determination unit 31 compares the difference spectrum with the infrared absorption spectrum indicating the Si—F stretching vibration stored in advance in the storage 32, thereby determining whether or not the difference spectrum indicates the presence of SiF-based substances (Step ST13 in FIG. 5). In the continuous cleaning process of the substrate W, the determination "the difference spectrum indicates the presence of SiF-based substances" is made even once, the determination in Step ST13, which is repeated thereafter, is always "the difference spectrum indicates the presence of SiF-based substances".

Then, when the difference spectrum does not indicate the presence of SiF-based substances (that is, the difference spectrum does not sufficiently peak at the wavenumber value of the infrared absorption spectrum illustrated in FIG. 6), the determination unit 31 closes the control valve 24 to end the cleaning process of the substrate W (Step ST14 in FIG. 5). Then, the determining section 31 transports the substrate W out of the processing chamber 2 through other processing steps such as a decompression step (Step ST15 in FIG. 5).

On the other hand, when the difference spectrum indicates the presence of SiF-based substances (that is, the difference spectrum sufficiently peaks at the wavenumber value of the infrared absorption spectrum illustrated in FIG. 6), the determination unit 31 determines whether or not the substance amount of the (current) SiF-based substances is equal to or lower than a predetermined threshold value (first threshold value) (Step ST16 in FIG. 5).

Then, when the (current) substance amount of the SiF-based substances is equal to or lower than the threshold value (that is, when the peak height is equal to or lower than the threshold value), the determination unit 31 closes the control valve 24 to end the cleaning process of the substrate W (Step ST14 in FIG. 5). Then, the determining section 31 transports the substrate W out of the processing chamber 2 through other processing steps such as a decompression step (Step ST15 in FIG. 5).

On the other hand, when the (current) substance amount of SiF-based substances is higher than the threshold value (that is, when the peak height is higher than the threshold value), the determination unit 31 returns to Step ST11, while continuing the cleaning process of the substrate W. That is, the Si—F stretching vibration is repeatedly detected.

Here, as a condition when determining whether or not the presence of SiF-based substances is indicated in Step ST13 above, the peak height corresponding to the infrared absorption spectrum illustrating the Si—F stretching vibration being equal to or higher than a threshold value (second threshold value) may be adoptable.

It is assumed that, in the cleaning process of the substrate W, SiF-based residues remain most immediately after the etching process, and the amount thereof decreases as the cleaning process progresses. Therefore, setting two threshold values according to changes in the amount of residual of the SiF residues can improve the accuracy of identifying the SiF residues. Here, the second threshold value may or may not be the same value as the first threshold value. Also, although the ideal value for the first threshold value is zero (undetected), the first threshold value may be set, in advance by experiment or the like, to a value so low that defects such as silicon defects or particle formation do not occur.

In the ending operation of the cleaning process, while the substrate W is being cleaned, light is irradiated from the light source 51 to continue the cleaning process of the substrate W, and determination is performed on which whether or not the SiF-based residues on the upper surface of the substrate W are sufficiently removed. In such a case, the end timing of the cleaning process can be determined without interrupting the cleaning process of the substrate W, so the efficiency of substrate processing is improved. At this point, the wavenumber of the OH stretching vibration mainly detected from the vapor used in the cleaning process of the substrate W, is, for example, 3600 cm$^{-1}$ or more and 2500 cm$^{-1}$ or less, which is greatly different from the wavenumber of the SiF stretching vibration (945 cm$^{-1}$) mainly detected from the SiF-based residues; therefore, the detection accuracy of the Si—F stretching vibration is not greatly affected.

Note, the cleaning process of the substrate W may be interrupted, light may be irradiated from the light source 51 and then whether or not the SiF-based residues on the upper surface of the substrate W are sufficiently removed may be determined.

<Effect Produced by Embodiment Described Above>

Next, an example of effect produced by the embodiment described above is illustrated. In the following description, although the effect will be described based on the specific configuration exemplified in the embodiment described above, the specific configuration may be replaced with other specific configurations exemplified in the specification of the present application as long as the similar effect is produced. That is, hereinafter, for the sake of convenience, although a sole specific configuration of the associated specific configurations may be described as a representative, the specific configuration may also be replaced with the other specific configurations to which the representatively described specific configuration.

According to the embodiment described above, in the etching method, the inside of the processing chamber 2 accommodating the substrate W is brought into a reduced pressure state. After the step of creating the reduced pressure state, the etching gas containing hydrogen fluoride is supplied into the processing chamber 2 to etch the coating film formed on the substrate W. Here, the coating film corresponds to, for example, the silicon oxide film 70 or the like. And the vapor 44A is supplied into the processing chamber 2 to clean the substrate W after the step of etching the silicon oxide film 70. Here, in the step of cleaning the substrate W, the Si—F stretching vibration in the substrate W is detected by infrared spectroscopy. Further, the step of cleaning the substrate W ends when the Si—F stretching vibration in the substrate W equal to or lower than the predetermined first threshold value is detected.

According to such a configuration, the cleaning process of the substrate W ends at the timing at which the residues are removed; therefore, the time required for cleaning the substrate W is suppressed from being unnecessarily long while the SiF-based residues remaining on the upper surface of the substrate W after the etching of the silicon oxide film 70 are appropriately removed.

Further, according to the embodiment described above, in the etching method, the supply of the vapor 44A is stopped when the Si—F stretching vibration lower than the threshold value is detected. Further, the substrate W is taken out from the processing chamber 2 after the step of stopping the supply of the vapor 44A. According to such a configuration, the substrate W can be smoothly transported out of the processing chamber 2 after the step of cleaning the substrate W ends.

Further, according to the embodiment described above, the step of detecting the Si—F stretching vibration is the step of detecting the peak height of the spectrum of the wavenumber corresponding to the Si—F stretching vibration. According to such a configuration, the amount of the SiF-based residues can be detected with high accuracy according to the peak height of the wavenumber spectrum, and this allows the appropriate determination of the timing of the end of the cleaning process.

Further, according to the embodiment described above, the step of cleaning the substrate W ends when the Si—F stretching vibration in the substrate W equal to or lower than the first threshold value is detected after the Si—F stretching vibration equal to or higher than the predetermined second threshold value is detected. According to such a configuration, the SiF-based residues remaining on the upper surface of the substrate W are effectively removed while reliably detecting the Si—F stretching vibration.

According to the embodiment described above, the etching apparatus includes the decompression pump 8, an etching gas supply unit, a vapor supply unit, a detection unit, and the controller 3. Here, the etching gas supply unit corresponds to a gas supply mechanism that mixes gases supplied from the gaseous hydrogen fluoride supply source 43 and the vapor supply source 44 and supplies the mixture into the processing chamber 2, for example. Also, the vapor supply unit corresponds to a vapor supply mechanism that supplies vapor supplied from the vapor supply source 44 into the processing chamber 2, for example. Also, the detection unit corresponds to the FTIR 50, for example. The decompression pump 8 creates a reduced pressure state inside of the processing chamber 2 accommodating the substrate W. The etching gas supply unit supplies the etching gas containing hydrogen fluoride into the processing chamber 2. The vapor supply unit supplies vapor supplied into the processing chamber 2. The FTIR 50 detects the Si—F stretching vibrations in the substrate W by infrared spectroscopy. The controller 3 controls at least the operations of the etching gas supply unit, the vapor supply unit, and the FTIR 50. Specifically, the controller 3 controls the etching gas supply unit so that the etching gas is supplied into the processing chamber 2 which is in the reduced pressure state. Further, the controller 3 controls the vapor supply unit so that vapor is supplied into the processing chamber 2 after the etching gas has been supplied. Further, the controller 3 controls the FTIR 50 so that the Si—F stretching vibration is detected in the processing chamber 2 supplied with the water vapor. Further, the controller 3 controls the vapor supply unit so that the supply of vapor is stopped when the Si—F stretching vibration equal to or lower than the predetermined threshold value is detected in the substrate W.

According to such a configuration, the cleaning process of the substrate W ends at the timing at which the residues are removed; therefore, the time required for cleaning the substrate W is suppressed from being unnecessarily long while the SiF-based residues remaining on the upper surface of the substrate W after the etching of the silicon oxide film 70 are appropriately removed.

Also, according to the embodiment described above, the FTIR 50 includes the light source 51 and the light receiving unit 52. Also, the etching apparatus includes a plate portion. Here, the plate portion corresponds to the gas distribution plate 6 or the like, for example. The light source 51 is arranged below the substrate W. The light receiving unit 52 is arranged above the substrate W and receives light output from the light source 51. The gas distribution plate 6 is arranged above the substrate W and has a plurality of openings 61 formed therein. Light emitted from the light source 51 passes through the openings 61 in the gas dispersion plate 6 and is received by the light receiving unit 52.

With such a configuration, the light emitted from the light source 51 reaches the light receiving unit 52 without being interfered with the gas dispersion plate 6, so that high detection accuracy of the light spectrum at the FTIR 50 can be maintained.

MODIFICATION EXAMPLE OF EMBODIMENT DESCRIBED ABOVE

In the embodiment described above, although the material, raw material, size, shape, relative arrangement relationship, implementation conditions, etc. of each component may be described, these elements are mere examples in all aspects, and shall not be limiting.

Thus, it is understood that numerous other modification examples and equivalents not having been described can be devised without departing from the scope of the technique disclosed in the specification of the present application. For example, modifying, adding, or omitting at least one component shall be involved.

Further, in the above-described embodiment, when a material name or the like is described without being specified, the material contains other additives, for example, an alloy or the like, so far as consistent with the embodiment.

While the invention has been shown and described in detail, the foregoing description is in all aspects illustrative and not restrictive. It is therefore understood that numerous modifications and variations can be devised without departing from the scope of the invention.

What is claimed is:

1. An etching method of etching a coating film containing silicon formed on a substrate, comprising:
    creating a reduced pressure state inside of a processing chamber accommodating the substrate;
    after creating the reduced pressure state, supplying an etching gas containing hydrogen fluoride into the processing chamber and etching the coating film formed on the substrate;
    after etching the coating film, cleaning the substrate by supplying vapor into the processing chamber; and
    in cleaning the substrate, detecting Si-F stretching vibration in the substrate by infrared spectroscopy, wherein the cleaning of the substrate ends when the Si-F stretching vibration equal to or lower than a predetermined first threshold value is detected.

2. The etching method according to claim 1, further comprising:
    stopping supplying the vapor when the Si-F stretching vibration equal to or lower than the first threshold value is detected; and
    after stopping supplying the vapor, taking out the substrate from the processing chamber.

3. The etching method according to claim 1, wherein in detecting the Si-F stretching vibration, detecting a peak height of a spectrum of a wavenumber corresponding to the Si-F stretching vibration.

4. The etching method according to claim 1, wherein cleaning of the substrate ends when the Si-F stretching vibration equal to or lower than the first threshold value is detected after the Si-F stretching vibration equal to or higher than a predetermined second threshold value is detected.

* * * * *